United States Patent

Ludikhuize

[11] Patent Number: 5,998,845
[45] Date of Patent: Dec. 7, 1999

[54] SEMICONDUCTOR DEVICE HAVING INCREASED SAFE OPERATING RANGE

[75] Inventor: Adrianus W. Ludikhuize, Eindhoven, Netherlands

[73] Assignee: U.S. Philips Corporation, New York, N.Y.

[21] Appl. No.: 08/995,468

[22] Filed: Dec. 22, 1997

[30]  Foreign Application Priority Data

Dec. 23, 1996 [EP] European Pat. Off. .............. 96203691

[51] Int. Cl.⁶ ................................................... H01L 29/76
[52] U.S. Cl. ........................................... 257/401; 257/343
[58] Field of Search ..................................... 257/343, 401

[56]  References Cited

U.S. PATENT DOCUMENTS 5,523,599  6/1996  Fujishima et al. ...................... 257/327
5,719,429  2/1998  Yoshida et al. .......................... 257/401

*Primary Examiner*—Mark V. Prenty
*Attorney, Agent, or Firm*—Steven R. Biren

[57] ABSTRACT

The breakdown voltage at high current values can be reduced in a HV-MOST with a weakly doped drain extension and a conventional interdigitated source/drain configuration, so that the SOAR (safe operating area) is reduced. The invention is based inter alia on the recognition that breakdown occurs at the end faces of the drain fingers at high current values owing to current convergences and the accompanying Kirk effect. To widen the SOAR of the transistor, the tips 8 of the drain fingers 5, 6 are rendered inactive in that the source fingers 4 are locally interrupted. In an optimized embodiment, the source fingers 4 shorter than the drain fingers 5,6.

3 Claims, 2 Drawing Sheets

SEMICONDUCTOR DEVICE HAVING INCREASED SAFE OPERATING RANGE

BACKGROUND OF THE INVENTION

The invention relates to a semiconductor device with a semiconductor body comprising a layer-shaped region of a first conductivity type which adjoins a surface and which is provided with a high-voltage MOST which comprises a source zone of the second, opposed conductivity type adjoining the surface and a drain zone of the second conductivity type adjoining the surface and separated from the source zone by an interposed channel region, which drain zone comprises a strongly doped surface zone situated at a distance from the channel region and a weakly doped zone which forms a drain extension, is connected to the former zone, and extends up to the channel region, said source and drain zones of the transistor having an interdigitated configuration with at least three elongate zones of the second conductivity type lying next to one another, of which the central zone forms part of the drain zone and comprises at least an end face, while the two outermost zones situated on either side of the central zone each form part of the source zone.

MOS transistors with interdigitated source/drain configurations are generally known. It is possible to obtain a current-passing capacity or an ON-resistance which are sufficiently high or sufficiently low for the specific function of the transistor through the number of fingers and/or the length of the fingers. It is usual to provide the source zone and the channel region not only along the longitudinal sides of the drain fingers but also around the end faces of the drain fingers so as to achieve a maximum efficiency in space utilization in the semiconductor body. It is generally known, furthermore, that the breakdown voltage of a field effect transistor can be increased in that the drain is provided with a high-ohmic drain extension situated between the low-ohmic drain and the channel region.

It was found in practice that the current-voltage area within which a MOS transistor of the kind indicated above can be safely operated (SOAR=safe operating area) is often smaller than might be expected. It appears more in particular that the breakdown voltage of the transistor is strongly reduced at great current densities.

SUMMARY OF THE INVENTION

The invention has for its object to provide a transistor with an interdigitated source/drain configuration which can be operated within a sufficiently large current-voltage area.

According to the invention, a semiconductor device of the kind described in the opening paragraph is for this purpose characterized in that the outermost zones extend alongside the central zone substantially parallel to the longitudinal direction of the central zone and are separated from one another at said end face of the central zone by a portion of the layer-shaped region of the first conductivity type. The absence of the source at the area of the tips of the drain fingers prevents completely or at least substantially completely that a current will flow from the source to the tips of the drain fingers. It is surprisingly found that this leads to an increase in the breakdown voltage at strong currents and thus to an increase in the SOAR. The invention is based inter alia on the recognition that the breakdown voltage may be governed by Kirk effects caused by moving electric charge. In a configuration in which the source extends around the tips of the drain fingers, an increase in the current density will occur at the areas of the drain fingers owing to current convergence. An intensification of the electric field will occur there more readily owing to the Kirk effect than in locations having a uniform current distribution. The result of this is that breakdown can occur at a lower voltage in the case of a strong current than in the case of a weak current. This reduction in the breakdown voltage is avoided in a device according to the invention in that the tips of the drain fingers are rendered inactive.

An embodiment in which current passage at the tips of the drain fingers is optimally prevented is characterized in that, seen at the surface, the drain zone extends farther into the semiconductor body at said end face than do the source zones situated on either side thereof. It is noted for completeness' sake that a DMOST is known from U.S. Pat. No. 5,523,599, in particular FIG. 7 of this patent, with an interdigitated source/drain configuration in a high-ohmic n-well. The n-well, and thus also the source, is interrupted at the areas of the tips of the drain fingers. The reason for this is that the n-well now forms a pn junction with the high-ohmic p-type substrate at the areas of the tips of the drain fingers. A higher breakdown voltage is obtained thereby than if the n-well were not interrupted and were to form a pn junction with the more strongly doped p-type base region of the transistor in that case, so that the breakdown would be lower because the doping concentration of the base region is higher than the background concentration of the substrate.

BRIEF DESCRIPTION OF THE DRAWING

These and other aspects of the invention will be explained in more detail with reference to an embodiment. In the drawing.

DESCRIPTION OF THE PREFERRED EMBODIMENTS

Figure 1:
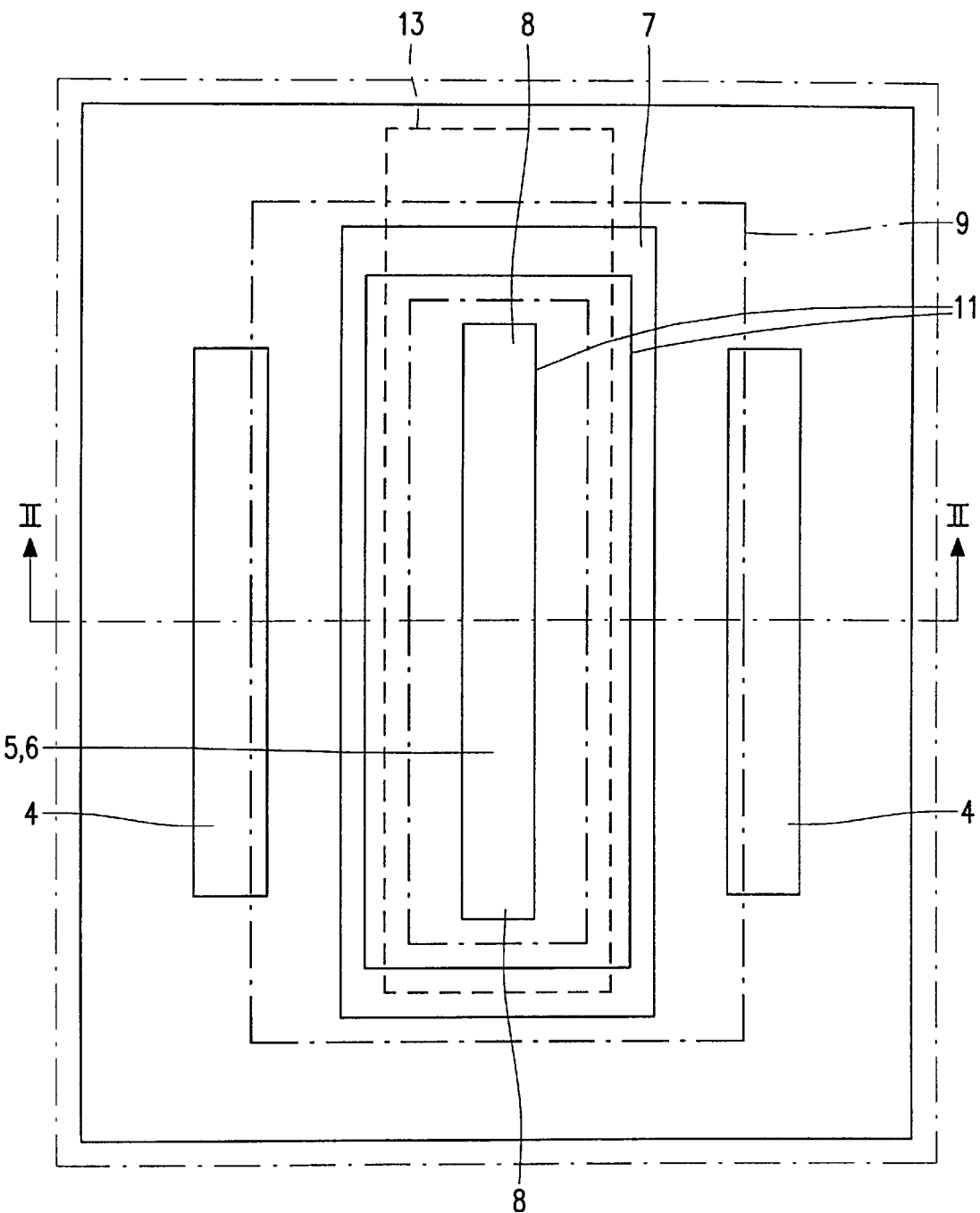
FIG. 1 is a diagrammatic plan view of a semiconductor device according to the invention.
Figure 2:
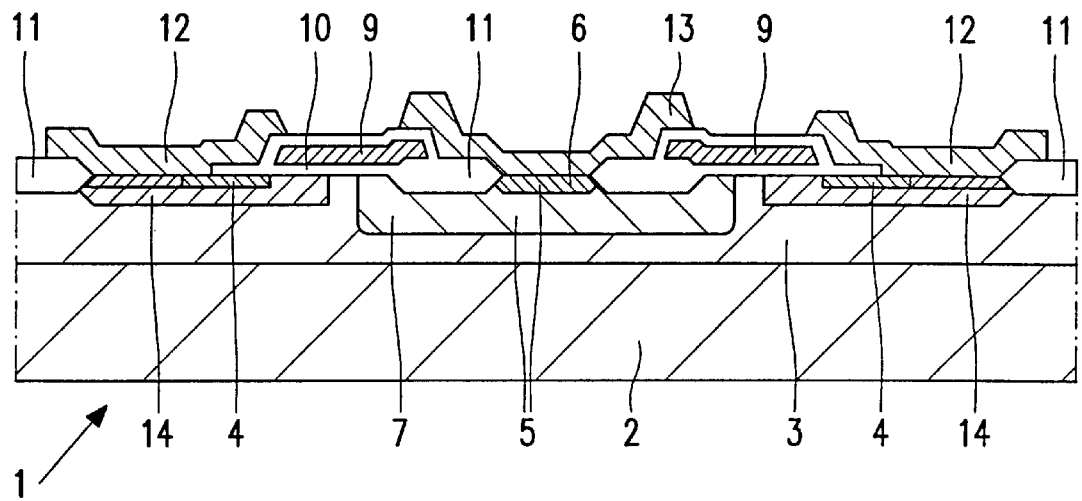
FIG. 2 is a cross-section of this device taken on the line II—II.

It is noted that the drawing is diagrammatic and not true to scale. Only a single transistor is shown in the drawing. It will be obvious, however, that circuit elements other than this transistor may well be provided in the semiconductor body.

The device comprises a semiconductor body 1, for example made of silicon, comprising a strongly doped substrate 2 of a first conductivity type, in this example the p-type, and a layer-shaped p-type region 3 having a comparatively low doping concentration and adjoining the surface. The doping of the layer 3, which may be formed, for example, by epitaxy, is chosen such that the transistor to be formed therein can be operated at high voltages, for example a few hundreds of volts. The transistor comprises a source in the form of an n-type surface zone 4 and a drain situated at a distance therefrom and taking the form of an n-type surface zone 5. This zone is composed of a strongly doped zone 6 and a weakly doped zone 7 which forms a drain extension and which surrounds the strongly doped zone 6 within the layer-shaped p-type region 3, forming a pn-junction with the layer 3 with a high breakdown voltage.

As is evident from FIG. 1, the source and drain zones 4, 5 are provided in an interdigitated configuration in which the number of source and drain fingers is chosen in dependence on the desired current-passing capacity. In the example shown here, the drain 5 comprises only a single digit or finger-shaped zone with two end faces 8 at the ends of the finger. A finger-shaped zone 4 of the source is provided on either side of the drain finger.

The transistor further comprises a gate electrode 9 (indicated in FIG. 1 with a dash-dot line), for example made of doped polycrystalline silicon, which is insulated from the surface of the silicon body by gate oxide 10. The (thin) gate oxide 10 merges into thicker field oxide 11 above the drain extension 7, which field oxide is also provided along the outer circumference of the transistor. The source zone is connected to a source electrode 12, the drain zone to a drain electrode 13 made, for example, of Al. The plan view of FIG. 1 only shows the drain electrode 13 (in broken lines). The drain electrode extends over the thick oxide 11 to beyond the drain 6 and operates as a field plate in this region. To obtain the desired threshold voltage, a p-type surface zone 14 is provided in the p-type layer 3, which surface zone extends into the channel region of the transistor and around the source 4 and is also connected to the source electrode and is short-circuited to the source via this electrode.

According to the invention, the zones 4 extend substantially parallel to the longitudinal direction of the central zone 5 alongside this central zone and are separated from one another at said end faces 8 of the drain by a portion of the layer-shaped p-type region 3.

Figure 3:
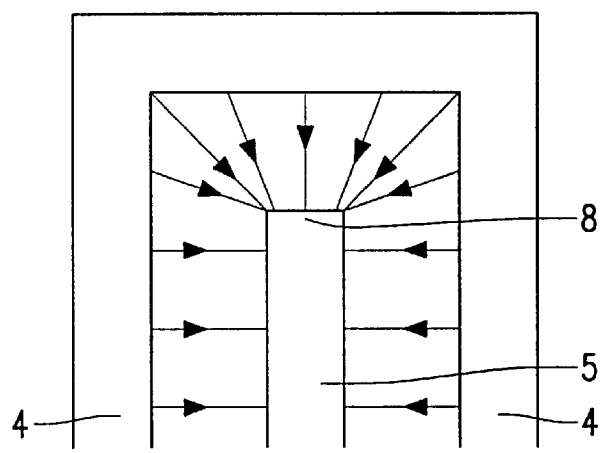
FIG. 3 is a plan view of a MOST according to a conventional design.

It is true that this measure slightly reduces the current-passing capacity of the transistor at a given surface area, but the important advantage is obtained that the current-voltage area within which the transistor can be operated (SOAR) is substantially increased. To clarify the effect of the measure according to the invention, FIG. 3 shows a plan view of a MOST in which the source extends not only along the longitudinal sides of the drain finger 5 but also along the end face 8 of the drain finger. The arrows in FIG. 3 indicate the current of electrons between the source 4 and the drain 5. As can be seen in the drawing, current convergence occurs at the end face of the drain. The electric field is intensified at the end face 8 owing to the Kirk effect as compared with the longitudinal sides of the drain, where the current density is much less. The result of this is that, given a certain high current value, the device will be more prone to breakdown (possibly accompanied by irreparable damage) than at low current values. This effect may arise in particular during switching of capacitive loads because in that case the current and the voltage can be at maximum levels simultaneously. This disadvantage is counteracted in a simple manner in that the transistor is rendered inactive at the end faces of the drain through a local interruption in the source, and the current-voltage area within which the transistor can be safely operated (SOAR) can be advantageously considerably increased.

In the embodiment shown, the source fingers 4 are shorter than the drain finger 5. It is prevented thereby in an optimum manner that the current is passed through the tips 8 of the drain, which means that the breakdown voltage can be additionally increased compared with the situation in which the drain fingers and source fingers are of the same length.

In the embodiment described here, the gate electrode 9 extends along the entire circumference of the drain 5, as seen in plan view. In an alternative embodiment, the gate electrode 9 may obviously be omitted in locations where the source is absent.

It will be evident that the invention is not limited to the example given here, but that many more variations are possible to those skilled in the art within the scope of the invention. Thus, for example, the conductivity types may be interchanged in the example described. The end face of the drain 6 may also have a more rounded shape so as to obtain a favorable field distribution. The end face of region 7 may also be rounded for very high voltages. The invention may be used to advantage in embodiments in which the drain comprises two or more fingers, each such finger being flanked on either side by a finger of the source.

What is claimed is:

1. A semiconductor device with a semiconductor body comprising a layer-shaped region of a first conductivity type which adjoins a surface and which is provided with a high-voltage MOST which comprises a source zone of the second, opposed conductivity type adjoining the surface and a drain zone of the second conductivity type adjoining the surface and separated from the source zone by an interposed channel region, which drain zone comprises a strongly doped surface zone situated at a distance from the channel region and a weakly doped zone which forms a drain extension, is connected to the former zone, and extends up to the channel region, said source and drain zones of the transistor having an interdigitated configuration with at least three elongate zones of the second conductivity type lying next to one another, of which the central zone forms part of the drain zone and comprises two end faces, while the two outermost zones situated on either side of the central zone each form part of the source zone, characterized in that the outermost zones extend alongside the central zone substantially parallel to the longitudinal direction of the central zone and are separated from one another at said two end faces of the central zone by a portion of the layer-shaped region of the first conductivity type.

2. A semiconductor device as claimed in claim 1, characterized in that, seen at the surface, the drain zone extends farther into the semiconductor body at said end face than do the source zones situated on either side thereof.

3. A semiconductor device as claimed in claim 1, characterized in that the strongly doped drain zone is provided with a drain electrode which is connected to the drain zone via a window in an electrically insulating layer and which, seen at the surface, extends over the insulating layer at the end face of the drain zone to beyond the strongly doped drain zone so as to form a field plate.

* * * * *